United States Patent
Kim et al.

(10) Patent No.: US 7,863,111 B2
(45) Date of Patent: Jan. 4, 2011

(54) THIN FILM TRANSISTOR FOR DISPLAY DEVICE INCLUDING A DISPERSED CARBON NANOTUBE DISPERSED CONDUCTIVE POLYMER AND MANUFACTURING METHOD OF THE SAME

(75) Inventors: Jun-seong Kim, Hwaseong-si (KR);
Euk-che Hwang, Osan-si (KR);
Ki-deok Bae, Yongin-si (KR);
Chang-seung Lee, Yongin-si (KR);
Hyeon-Jin Shin, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 257 days.

(21) Appl. No.: 11/898,126

(22) Filed: Sep. 10, 2007

(65) Prior Publication Data
US 2008/0224128 A1   Sep. 18, 2008

(30) Foreign Application Priority Data
Mar. 13, 2007   (KR) ............ 10-2007-0024673

(51) Int. Cl.
*H01L 51/05* (2006.01)
(52) U.S. Cl. .......... 438/142; 438/584; 438/666; 438/669; 977/742; 977/753; 977/856; 977/857
(58) Field of Classification Search .......... 977/938, 977/753, 742, 856, 857; 438/142, 149, 151, 438/197, 584, 666, 669; 257/213, 262, 288
See application file for complete search history.

(56) References Cited

U.S. PATENT DOCUMENTS

| | | | |
|---|---|---|---|
| 6,740,900 B2 * | 5/2004 | Hirai | 257/40 |
| 7,189,992 B2 * | 3/2007 | Wager et al. | 257/43 |
| 2005/0214195 A1 * | 9/2005 | Jung et al. | 423/445 B |
| 2006/0226441 A1 * | 10/2006 | Seo et al. | 257/190 |
| 2007/0166860 A1 * | 7/2007 | Tanaka et al. | 438/30 |
| 2008/0012006 A1 * | 1/2008 | Bailey et al. | 257/40 |
| 2008/0090338 A1 * | 4/2008 | Tredwell et al. | 438/151 |
| 2009/0200517 A1 * | 8/2009 | El Bounia | 252/500 |

OTHER PUBLICATIONS

U. Buder et al., Reactive ion etching for bulk structuring of polyimide Jun. 19, 2006, Elsevier, Sensors and Actuators A 132 (2006) 393-399.*
M. Kaempgen et al, "Transparent carbon nanotube coatings", 2005, Applied Surface Science, vol. 252, pp. 425-429.*

* cited by examiner

*Primary Examiner*—David Vu
*Assistant Examiner*—Suberr Chi
(74) *Attorney, Agent, or Firm*—Harness, Dickey & Pierce, P.L.C.

(57) ABSTRACT

Provided are a thin film transistor for display devices and a manufacturing method of the thin film transistor. The thin film transistor for display devices includes: a flexible substrate; a gate electrode layer formed on the flexible substrate; a first insulating layer formed on the flexible substrate and the gate electrode; a source and a drain formed on the first insulating layer; an active layer formed on the first insulating layer between the source and the drain; a second insulating layer formed on the first insulating layer, the source, the drain, and the active layer; and a drain electrode that opens the second insulating layer to be connected to the drain and is formed of a CNT dispersed conductive polymer.

9 Claims, 5 Drawing Sheets

B 42  41

THIN FILM TRANSISTOR FOR DISPLAY DEVICE INCLUDING A DISPERSED CARBON NANOTUBE DISPERSED CONDUCTIVE POLYMER AND MANUFACTURING METHOD OF THE SAME

CROSS-REFERENCE TO RELATED PATENT APPLICATION

This application claims the benefit of Korean Patent Application No. 10-2007-0024673, filed on Mar. 13, 2007 in the Korean Intellectual Property Office, the disclosure of which is incorporated herein in its entirety by reference.

BACKGROUND OF THE INVENTION

1. Field of the Invention

The present invention relates to a thin film transistor for display devices, and more particularly, to a thin film transistor with an electrode made of polymer including carbon nanotube (CNT) and a method of manufacturing the thin film transistor.

2. Description of the Related Art

A general flat panel display device includes electrodes for generating an electrical field and an active layer formed of an electro-optical material formed between the electrodes. In the flat panel display device, a thin film transistor (TFT) is used as a switching device in display devices, and research about organic TFTs is currently actively.

A conventional organic TFT is patterned to a desired shape by wet etching indium tin oxide (ITO) as an electrode material. The conventional TFT is manufactured as follows: a gate electrode is formed with a conductive material such as metal on a substrate, and an insulating material is coated on the gate electrode to form an insulating layer.

Then, a source and a drain are formed on the insulating layer, and an insulating material is coated thereon, and a via hole is formed to expose the drain electrode. Then, an electrode material such as ITO is filled into the via hole and patterned.

However, when patterning the electrode material such as ITO by wet etching, a flexible substrate such as a plastic substrate is adversely affected, which also adversely affects device characteristics. Thus, an electrode material that can be applied to the flexible display device without difficulty and a manufacturing method of the electrode formed of the electrode material are required.

SUMMARY OF THE INVENTION

The present invention provides a thin film transistor for display devices that does not affect the characteristics of a flexible display device adversely by using a carbon nanotube (CNT) dispersion conductive polymer as an electrode of the thin film transistor for display devices, and a manufacturing method of the thin film transistor for display devices.

According to an aspect of the present invention, there is provided a thin film transistor comprising: a flexible substrate; a gate electrode layer formed on the flexible substrate; a first insulating layer formed on the flexible substrate and the gate electrode; a source and a drain formed on the first insulating layer; an active layer formed on the first insulating layer between the source and the drain; a second insulating layer formed on the first insulating layer, the source, the drain, and the active layer; and a drain electrode that penetrates the second insulating layer to be connected to the drain, wherein the drain electrode comprises a Carbon Nanotube (CNT) dispersed conductive polymer.

The source and the drain may comprise a Carbon Nanotube (CNT) dispersed conductive polymer.

The active layer may comprise a-Si, ZnO, or pentacene.

According to another aspect of the present invention, there is provided a method of manufacturing a thin film transistor for display devices, the method comprising: (a) forming a gate layer on a substrate; (b) forming a first insulating layer on the substrate and the gate layer, and then forming a source and a drain on the first insulating layer; (c) coating an active material on the first insulating layer, the source, and the drain to form an active layer; (d) forming a second insulating layer on the first insulating layer, the source, the drain, and the active layer, and forming a via hole in the second insulating layer to expose the drain; and (e) forming a drain electrode by coating a Carbon Nanotube (CNT) dispersed conductive polymer in the via hole and on the second insulating layer.

The operation (e) of the method may comprise coating the Carbon Nanotube (CNT) dispersed polymer, forming a Photoresist (PR) layer on the Carbon Nanotube (CNT) dispersed polymer, and then etching at 50-150° C. using an Inductively Coupled Plasma-Reactant Ion Etching (ICP-RIE) process.

A mixed gas of $O_2$ and $SF_6$ may be used in the Inductively Coupled Plasma-Reactant Ion Etching (ICP-RIE) process.

The partial pressure of $SF_6$ may be maintained 20% or less.

The operation (b) of the method may comprise forming a source and a drain by coating and etching a Carbon Nanotube (CNT) dispersed conductive polymer on the first insulating layer.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Figure 1:
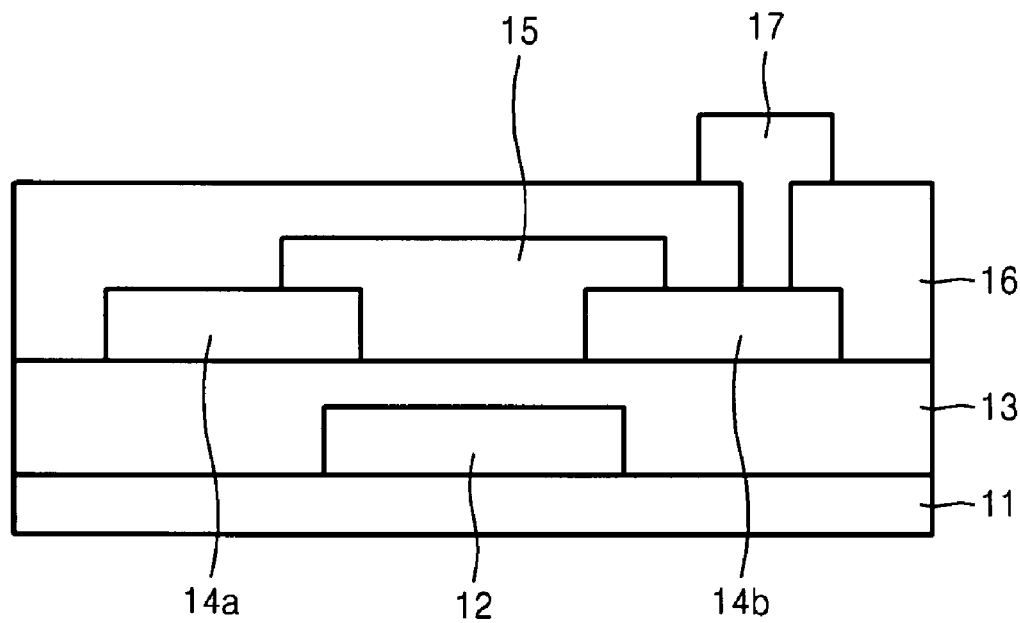
FIG. 1 illustrates a thin film transistor for display devices according to an embodiment of the present invention.

The present invention will now be described more fully with reference to the accompanying drawings, in which exemplary embodiments of the invention are shown. In the drawings, the thicknesses of layers or regions are exaggerated for clarity.

FIG. 1 illustrates a thin film transistor for display devices according to an embodiment of the present invention.

Referring to FIG. 1, a flexible substrate 11, a gate electrode layer 12 formed on the flexible substrate 11, and a first insulating layer 13 formed on the flexible substrate 11 and the gate electrode layer 12 are formed. A source 14a and a drain 14b are formed on the first insulating layer 13, and an active layer 15 is formed between the source 14a and the drain 14b. A second insulating layer 16 is formed on the first insulating layer 13, the source 14a, the drain 14b, and the active layer 15. A drain electrode 17 is formed through the second insulating layer 16 on the drain 14.

In the current embodiment of the present invention, the drain electrode 17 is formed of a polymer in which carbon nanotube (CNT) powder is dispersed. Also, the source 14a and the drain 14b may be formed of the polymer in which CNT is dispersed. The substrate 11 may be formed of plastic that is usually used as a general flexible substrate, and the first insulating layer 13 may be formed of a material such as $SiO_2$, $Si_3N_4$, etc. The source 14a and the drain 14b may be formed of a conductive material that is usually used for a source electrode and a drain electrode of a thin film transistor for display devices, and may be formed of a conductive transparent polymer in which CNT is dispersed. The active layer 15 may be formed of a material used in a display driving thin film transistor, for example, of a-Si, ZnO, and in the case of an organic thin film transistor, pentacene may be used as the active layer 15. The second insulating layer 16 may be formed as a passivation layer, of $Si_3N_4$, for example.

Hereinafter, a method of manufacturing a thin film transistor for display devices according to the current embodiment of the present invention will be described with reference to FIGS. 2A through 2F.

Figure 2A:
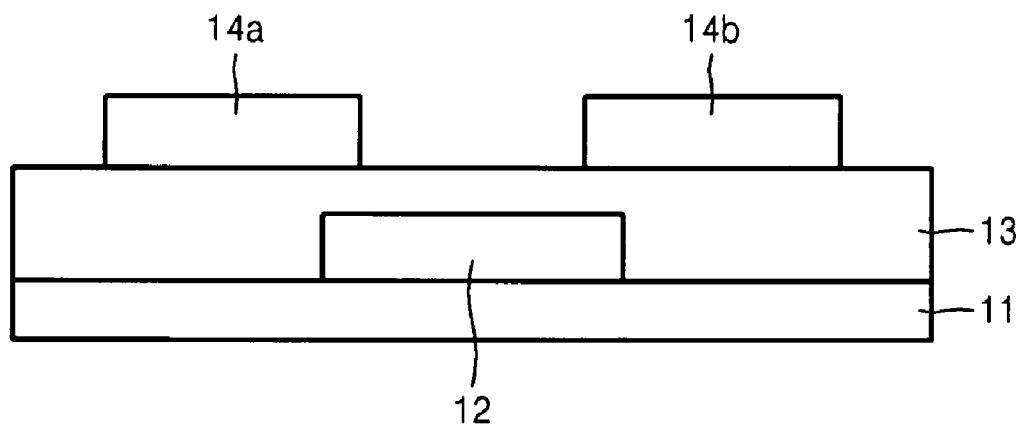
FIGS. 2A through 2F illustrate a method of manufacturing the thin film transistor according to an embodiment of the present invention.

Referring to FIG. 2A, a conductive material is coated on a flexible substrate 11 such as plastic and etched to form a gate electrode layer 12. An insulating layer such as $SiO_2$, $Si_3N_4$, etc. is coated on the gate electrode layer 12 to form an insulating layer. Then, a conductive material is coated on the insulating layer 13 and patterned to form a source 14a and a drain 14b. The source 14a and the drain 14b are formed of, for example, transparent polymer in which CNT is dispersed. The method of coating and patterning a transparent polymer in which CNT is dispersed will be described in more detail with reference to FIGS. 2E and 2F.

Figure 2B:
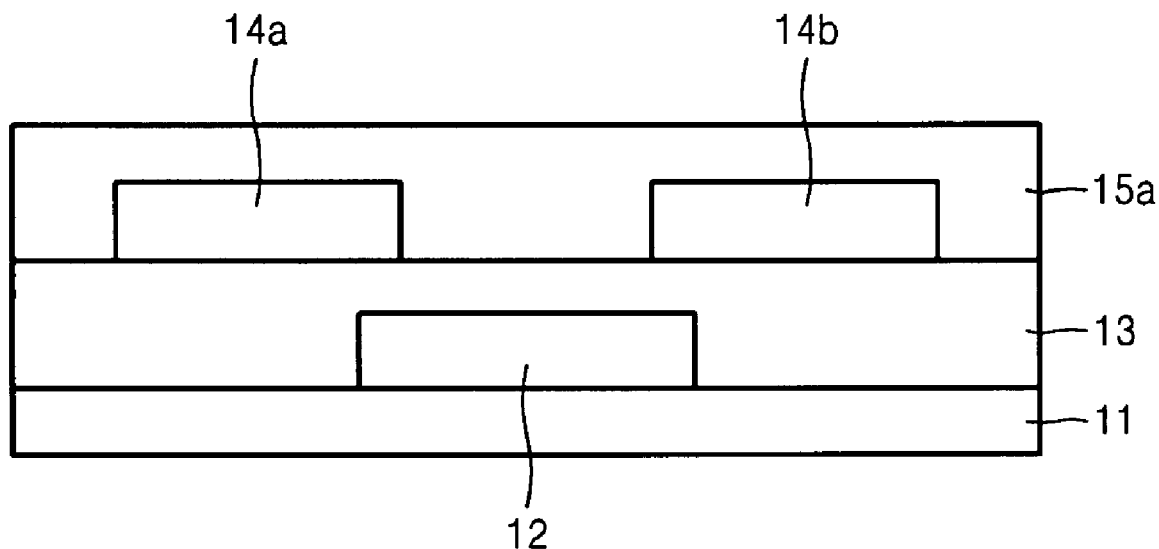
Figure 2C:
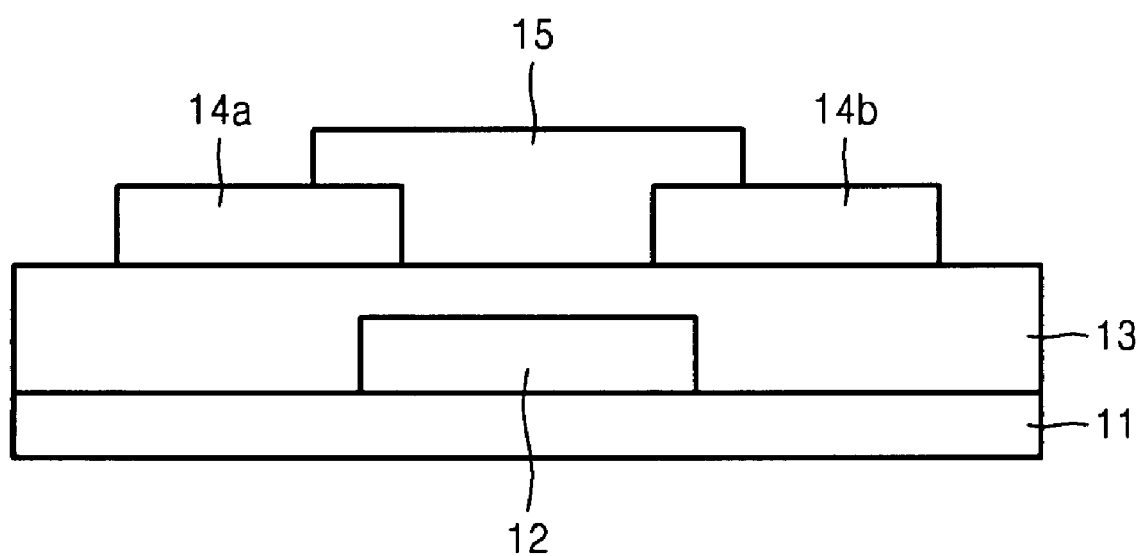

Referring to FIGS. 2B and 2C, an active material is coated on the first insulating layer 13, the source 14a, and the drain 14b and patterned to form an active layer 15. Here, the active material is a material used in a display driving thin film transistor, and may be a-Si, ZnO, InZnO, GaInZnO, for example, and in the case of an organic thin film transistor, pentacene can be used as an active material.

Figure 2D:
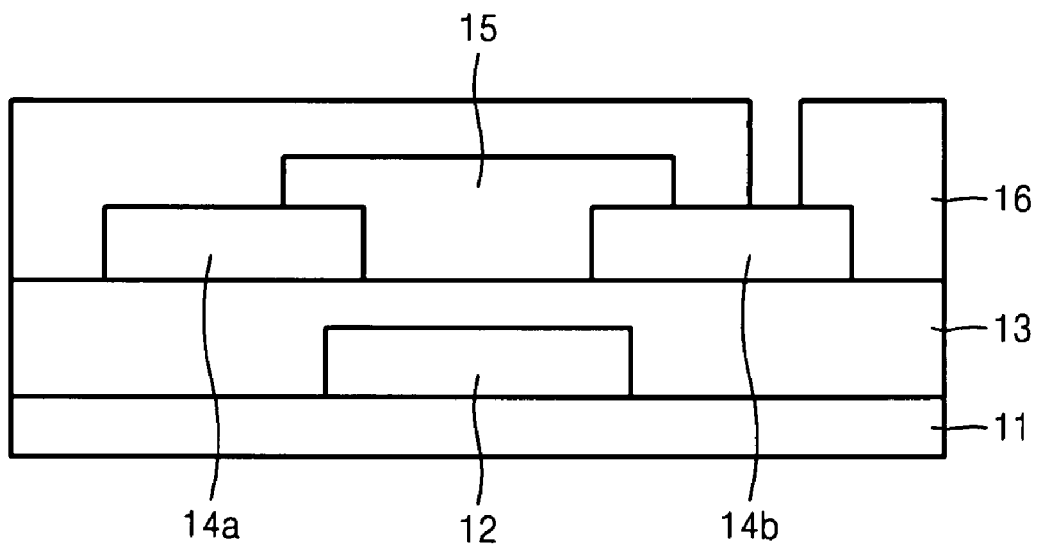

Referring to FIG. 2D, an insulating material for passivation such as $Si_3N_4$ is coated on the first insulating layer 13, the source 14a, the drain 14b, and the active layer 15, and a via hole is formed to exposed the drain 14b.

Figure 2E:
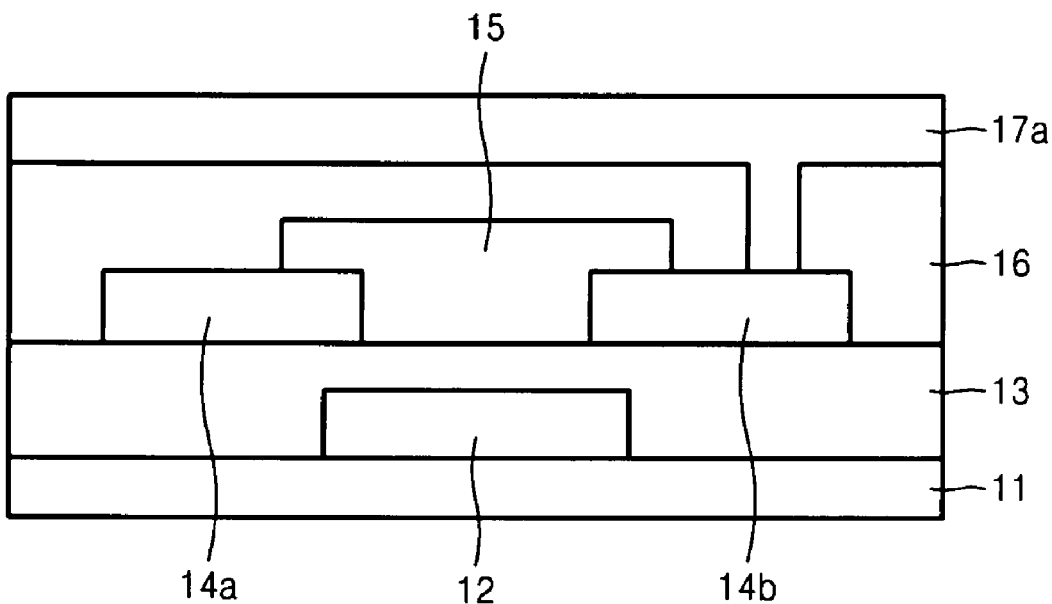

Referring to FIG. 2E, a transparent polymer in which CNT is dispersed is coated in the via hole on the drain 14b and on the second insulating layer 14b to form a CNT dispersed conductive polymer layer 17a. The CNT dispersed conductive transparent polymer may be the material illustrated in FIG. 3. Referring to FIG. 2E, the CNT dispersed conductive polymer layer 17a is patterned to form a drain electrode layer 17.

The CNT dispersed transparent polymer 17a is etched in the following manner.

First, a PR layer in a desired form is formed on the CNT dispersed polymer layer 17a, and etched by an inductively coupled plasma-reactant ion etching (ICP-RIE) process at 50-150° C. by setting a RF power (bias power) low at about 50 watt. By maintaining a low temperature plasma state of 150° C. or less, thermal damage of the flexible substrate 11, such as a plastic substrate, can be reduced, and damage of a conductive polymer while stripping the PR layer after the etching process can be prevented.

Figure 3:
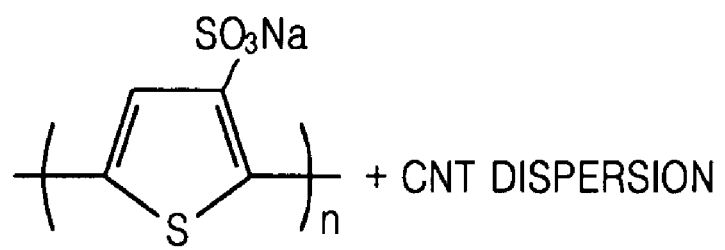
FIG. 3 illustrates an electrode material of the thin film transistor of the present invention.

Second, in addition to the first condition as described above, a mixed gas of $O_2$ and $SF_6$ is used as an etching gas, and the partial pressure of $SF_6$ is maintained 20% or under. Thus the second insulating layer 16 formed of, for example, $Si_3N_4$ is not adversely affected, and an etching process having high selectivity can be performed. When etching the CNT dispersed transparent polymer as illustrated in FIG. 3 using the above described ICP-RIE process, materials in the etching area are gasified into CO, $CO_2$, SO, $SO_4$, $N_2$, $Na_2O_3$, etc.

Figure 2F:
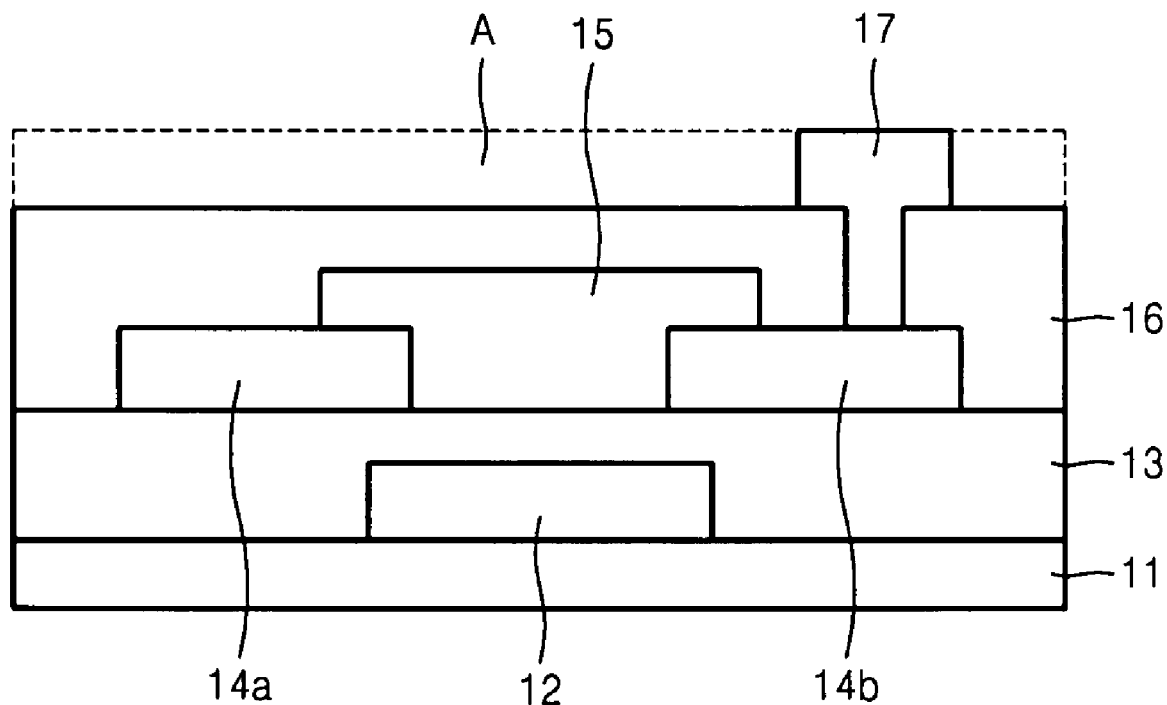

Referring to FIG. 2F, consequently, when performing the etching process in the above described manner consequently, deterioration of the characteristics of the thin film transistor due to thermal expansion of the flexible substrate and the insulating material can be prevented and the drain electrode 17 can be formed by removing a CNT dispersed conductive polymer in an area A. The source 14a and the drain 14b can also be formed of a CNT dispersed conductive polymer the above described manner.

Figure 4A:
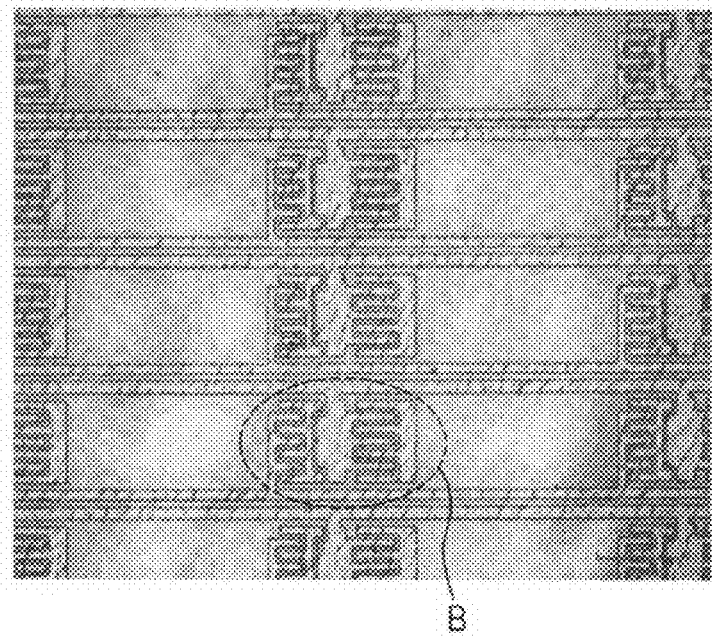
FIGS. 4A and 4B are photographs showing a device having CNT dispersed polymer as an electrode manufactured according to the manufacturing method of the thin film transistor of the present invention.
Figure 4B:
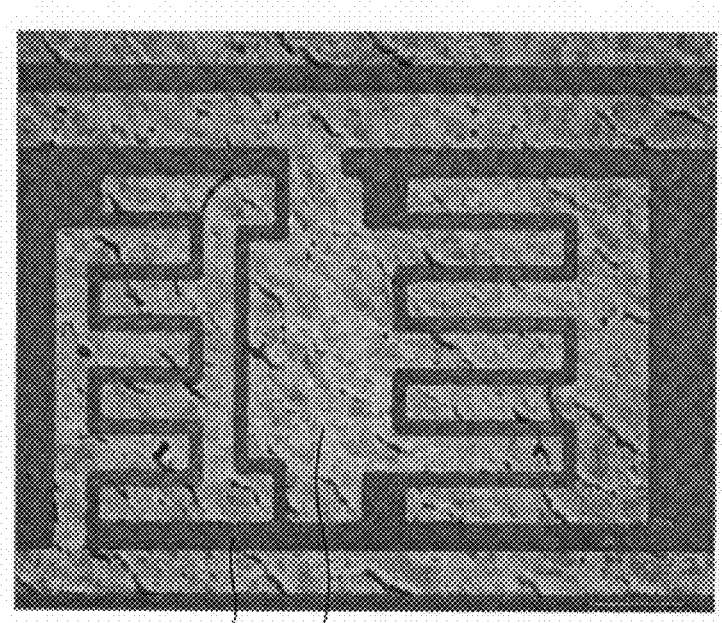

FIG. 4A is a photographic image showing a device coated with a CNT dispersed conductive polymer and etched in a predetermined form. FIG. 4B is an enlarged image of the area B of FIG. 4A. Referring to FIGS. 4A and 4B, a CNT dispersed conductive polymer is coated in a lower structure, and then the etching process as described above is performed. It can be noted that an electrode area 41 and an insulating layer area 42 are clearly distinguished and etched with a high selectivity.

While the present invention has been particularly shown and described with reference to exemplary embodiments thereof, the exemplary embodiments should be considered in descriptive sense only and not for purposes of limitation. The thin film transistor for display devices of the present invention and the method of manufacturing the thin film transistor can be used not only for organic thin film transistor but also for the overall manufacturing method of a thin film transistor for display devices such as an a-Si thin film transistor. Therefore, the scope of the invention is defined not by the detailed description of the invention but by the appended claims.

According to the present invention, the drain electrode which connects a drain and an ElectroLuminescent (EL) material, the source, or the drain are formed of a CNT dispersed conductive polymer and an ICP-RIE process is performed at a relatively low temperature, chemical and thermal damage of the flexible substrate can be prevented. Also, as the etching process having high selectivity between the passivation layer and the drain electrode is possible, deterioration of the characteristics of thin film transistor for display devices can be prevented.

What is claimed is:

1. A method of manufacturing a thin film transistor for display devices, the method comprising:
   forming a gate layer on a substrate;
   forming a first insulating layer on the substrate and the gate layer, and then forming a source and a drain on the first insulating layer;
   coating an active material on the first insulating layer, the source, and the drain to form an active layer;
   forming a second insulating layer on the first insulating layer, the source, the drain, and the active layer, and forming a via hole in the second insulating layer to expose the drain; and
   forming a drain connecting electrode by coating a Carbon Nanotube (CNT) dispersed conductive polymer in the via hole and on the second insulating layer, wherein the Carbon Nanotube (CNT) dispersed conductive polymer is a polymer in which a carbon nanotube powder is dispersed,
   wherein forming the first insulating layer and forming the source and the drain includes forming the source and the drain by coating and etching the Carbon Nanotube (CNT) dispersed conductive polymer on the first insulating layer.

2. The method of claim 1, wherein forming the drain connecting electrode includes coating the Carbon Nanotube (CNT) dispersed polymer, forming a Photoresist (PR) layer on the Carbon Nanotube (CNT) dispersed polymer, and then etching at 50-150° C. using an Inductively Coupled Plasma-Reactant Ion Etching (ICP-RIE) process.

3. The method of claim 2, wherein a mixed gas of $O_2$ and $SF_6$ is used in the Inductively Coupled Plasma-Reactant Ion Etching (ICP-RIE) process.

4. The method of claim 3, wherein the partial pressure of $SF_6$ is maintained 20% or less.

5. A method of manufacturing a thin film transistor for display devices, the method comprising:

forming a source and a drain on a substrate; and forming a connecting electrode, connected to at least one of the source and the drain, wherein the connecting electrode includes a Carbon Nanotube (CNT) dispersed conductive polymer, wherein the Carbon Nanotube (CNT) dispersed conductive polymer is a polymer in which a carbon nanotube powder is dispersed, wherein forming the source and the drain includes forming at least one of the source and the drain by coating and etching the Carbon Nanotube (CNT) dispersed conductive polymer.

6. The method of claim 5, further comprising a step of forming an insulating layer disposed between the source and the drain and the connecting electrode.

7. The method of claim 5, wherein forming the connecting electrode includes coating the Carbon Nanotube (CNT) dispersed polymer, forming a Photoresist (PR) layer on the Carbon Nanotube (CNT) dispersed polymer, and then etching at 50-150° C. using an Inductively Coupled Plasma-Reactant Ion Etching (ICP-RIE) process.

8. The method of claim 7, wherein a mixed gas of $O_2$ and $SF_6$ is used in the Inductively Coupled Plasma-Reactant Ion Etching (ICP-RIE) process.

9. The method of claim 8, wherein the partial pressure of $SF_6$ is maintained 20% or less.

* * * * *